United States Patent [19]

Ritchie et al.

[11] 4,278,991
[45] Jul. 14, 1981

[54] IC PACKAGE WITH HEAT SINK AND MINIMAL CROSS-SECTIONAL AREA

[75] Inventors: Ronald J. Ritchie, La Mesa; Daniel M. Andrews, San Marcos, Calif.

[73] Assignee: Burroughs Corporation, Detroit, Mich.

[21] Appl. No.: 65,940

[22] Filed: Aug. 13, 1979

[51] Int. Cl.³ .................... H01L 23/02; H01L 23/48; H01L 29/44
[52] U.S. Cl. ........................ 357/81; 357/70; 357/72; 357/80
[58] Field of Search ................. 357/70, 72, 81, 80

[56] References Cited

U.S. PATENT DOCUMENTS

| 3,735,214 | 5/1973 | Renskers | 357/72 |
| 3,781,976 | 1/1974 | Tomiwa | 357/72 |
| 3,836,825 | 9/1974 | Hall et al. | 357/81 |
| 3,922,712 | 11/1975 | Stryker | 357/70 |

OTHER PUBLICATIONS

IBM Technical Disclosure Bulletin, vol. 16, No. 4, Sep. 1973, by Deboskey p. 1153.
IBM Technical Disclosure Bulletin vol. 16, No. 9, Feb. 1974, by Nufer p. 2893.
Western Electric Technical Digest No. 46, Apr. 1977; Circuit Package p. 3.

Primary Examiner—Andrew J. James
Attorney, Agent, or Firm—Charles J. Fassbender; Kevin R. Peterson

[57] ABSTRACT

Disclosed is an IC package for connecting one set of nodes on an IC chip to another corresponding set of nodes on a circuit board. Each interconnection is made with a single C-shaped lead which is bonded at one end to a node on the chip. These leads extend outward from the periphery of the chip's surface, then perpendicular to and away from the chip's surface, and then inwards towards each other. A heat sink attaches to the back of the chip. The chip, an adjacent portion of the heat sink, and the outward extending portion of the leads are then encapsulated with a solid mass to hold them rigidly in place.

7 Claims, 10 Drawing Figures

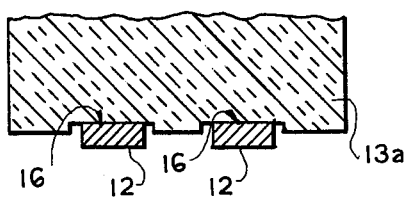
FIG. 3
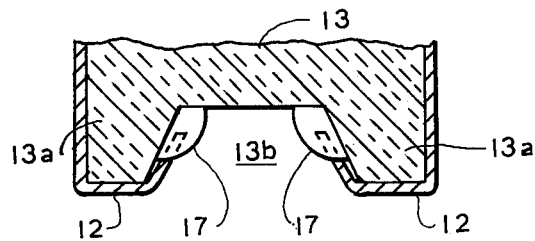
FIG. 4
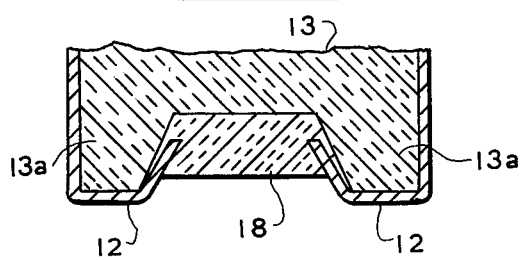
FIG. 5
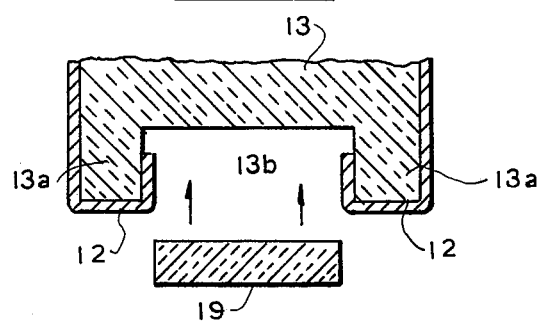
FIG. 6
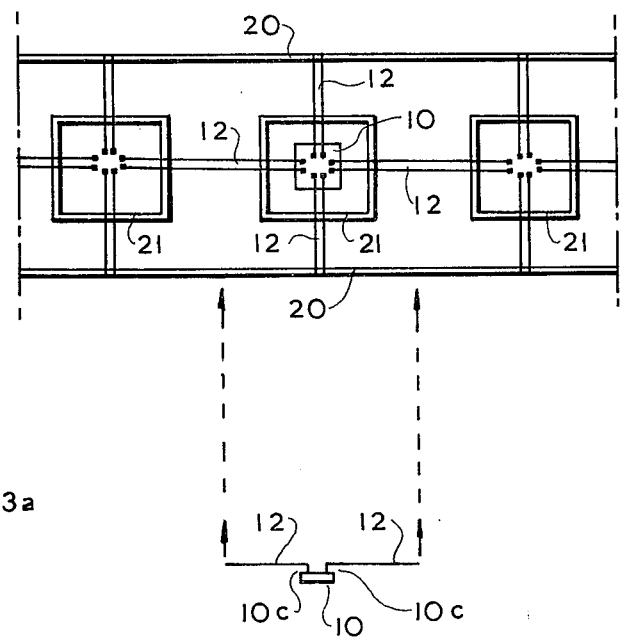
FIG. 7A
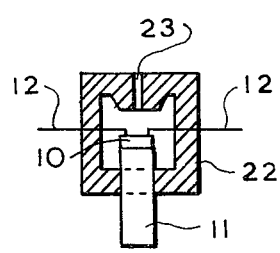
FIG. 7B
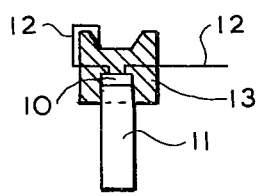
FIG. 7C
FIG. 7D

IC PACKAGE WITH HEAT SINK AND MINIMAL CROSS-SECTIONAL AREA

BACKGROUND OF THE INVENTION

This invention relates to integrated circuit (IC) packaging, and more particularly to those IC packages which provide the connections between one set of nodes on an IC chip and a corresponding set of nodes on a circuit board. In this application, the term IC package is defined to mean the latter type of package.

Typically, multiple IC packages are mounted on a single circuit board. Then, the IC packages are selectively interconnected with either printed conductors or discrete wires on the circuit board. Multiple circuit boards can also be selectively interconnected in various ways, such as by providing the boards with contact pins and inserting them into a backpannel.

In the prior art, practically all IC packages interconnected each node on the chip to its corresponding node on the circuit board with two serially connected leads. First, a relatively thin lead was bonded at one end to the node on the chip. This lead was either a discrete wire or a printed wire in a beam lead tape. In either case, the lead had to be thin since a typical IC chip is quite small (e.g. 120 mill × 120 mill) and thus the nodes on the chip are close to each other.

Next, a relatively thick lead was bonded to the opposite end of the thin lead. This thick lead was much more rigid than the thin lead which made it suitable for insertion into a via hole on the circuit board. Every node on the IC chip was similarly bonded to one thin lead and one thick lead. Then, the chip, the thin leads, and an adjacent portion of the thick leads were encapsulated to complete the IC package.

Many versions of the above IC package have been described in the prior art. For example, see U.S. Pat. Nos. 3,763,404 (FIG. 5); 3,909,838 (FIG. 1); 3,975,757 (FIG. 2); and 4,079,511 (FIG. 13). All of those IC packages are unattractive however because they require two bonding steps, as opposed to only one bonding step, for each node on the IC chip that is to be connected to the circuit board. These bonding steps are both time consuming and expensive to perform.

By comparison, U.S. Pat. No. 4,024,570 describes an IC package which connects each node on the chip to its corresponding node on the circuit board with only one relatively thin lead. The end of the thin lead that contacts the circuit board is not inserted into a via hole, but instead it is soldered to the surface of the circuit board. This is attractive since only one bonding step is required for each node on the chip. However, due to its particular structure, that IC package has several other drawbacks.

For example, the IC package of patent '570 occupies too much surface area on the circuit board. This is because it requires the use of a base plate that is substantially wider than the chip itself in order to hold the thin leads in place. In particular, the base plate attaches to and extends out from the bottom of the chip; and then the leads are glued in place on the extending portion of the base plate.

Another drawback in the IC package of patent '570 is that catastrophic shorts can occur between the leads and the sides of the base plate. In order to prevent those shorts, the leads cannot make a 90° turn from their glued position at top of the base plate to the underlying circuit board; but instead they must make contact with the circuit board at some smaller angle. This results in a further increase in the effective surface area of the IC package.

The above problem is most severe when the chip that is packaged dissipates a large amount of power. The reason is that in patent '570 the base plate also serves as the heat sink for the chip. Thus as power dissipation increases, the height of the base plate must also increase. And a high base plate makes shorts more likely, unless the leads are widely fanned out away from the base plate.

Therefore, it is a primary object of the invention to provide an improved IC package.

Another object of the invention is to provide an IC package that requires only one bonding step to fabricate for each node on the chip to be packaged, and which occupies a minimal amount of surface area on a circuit board.

BRIEF SUMMARY OF THE INVENTION

These and other objects are accomplished in accordance with the invention by an IC package that includes a semiconductor chip, a heat sink, a plurality of C-shaped leads, and a solid encapsulating mass. The chip is substantially flat; and it has first and second oppositely facing major surfaces with an integrated circuit disposed on the first major surface. One end of the C-shaped leads connect to respective nodes on the circuit. From there, the leads extend outward beyond the periphery of the chip, then they extend parallel to and away from the first major surface and then they extend inward towards each other. The heat sink has a cross-section that substantially matches the second major surface; and it is attached to that surface by an adhesive. The entire chip, the outward extending portions of the leads, and the heat sink are then held rigidly in place by the solid encapsulating mass.

Several embodiments of the above IC package are also disclosed. In each of these, that portion of the solid mass which overlies the first major surface has a cavity with a surrounding rim. All of the leads are bent over the rim and into the cavity to hold them even more firmly in place as they extend toward each other. Further, in one particular embodiment, a plurality of indentations are spaced apart around the rim; and the leads pass through these indentations to keep them spaced apart. In another embodiment, the leads are held in place by an adhesive material that lies between each of the leads and the inner walls of the rim. And in another embodiment, the leads are held in place by a solid mass that fills the cavity. This solid mass may either be preformed and wedged into the cavity; or it may be formed by filling the cavity with a liquid which subsequently hardens.

BRIEF DESCRIPTION OF THE DRAWINGS

Various features and advantages of the invention will best be understood by reference to the following Detailed Description and accompanying drawings wherein:

FIG. 3 is a sectional view taken along lines 3—3 of FIG. 1.

FIG. 4 is a sectional view illustrating one variation of the FIG. 1 embodiment.

FIG. 5 is a sectional view illustrating another variation of the FIG. 1 embodiment.

FIG. 6 is a sectional view illustrating still another variation of the FIG. 1 embodiment.

FIGS. 7A-7D illustrate various steps of a fabrication process for the FIG. 1 embodiment.

DETAILED DESCRIPTION

Figure 1:
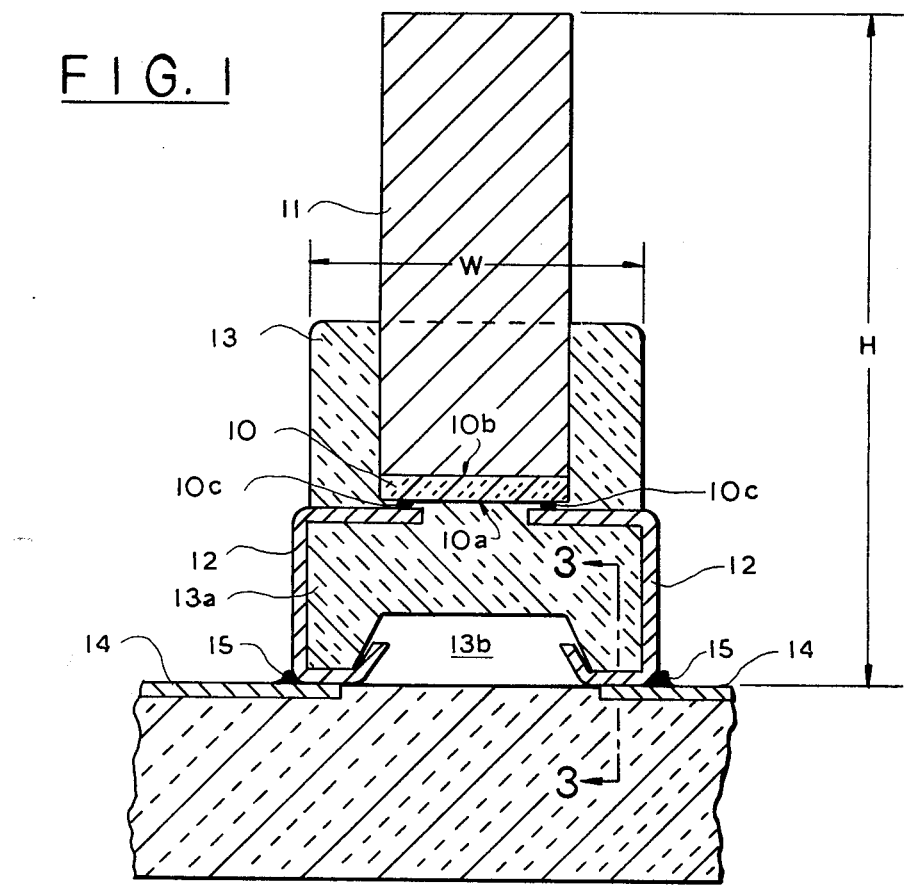
FIG. 1 is a sectional view of one preferred embodiment of the invention taken along lines 1—1 of FIG. 2.
Figure 2:
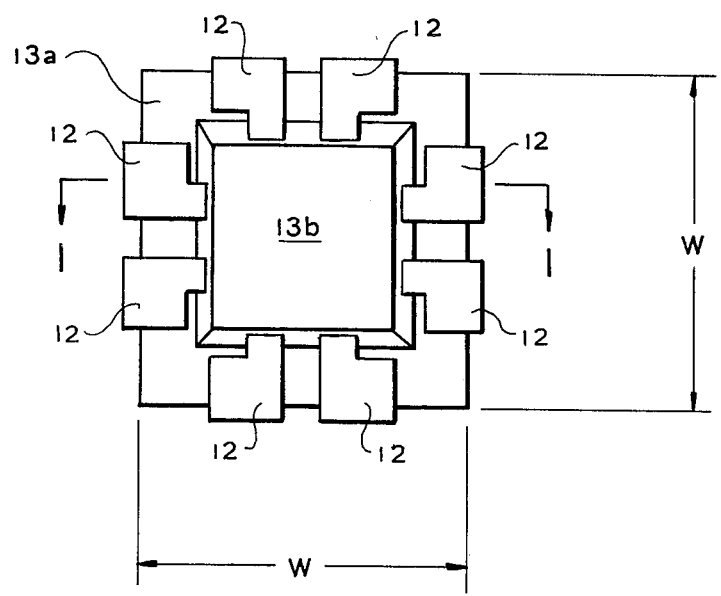
FIG. 2 is a plan view of the FIG. 1 embodiment.

Referring now to FIGS. 1 and 2, the details of one preferred embodiment of the invention will be described. The basic components of this embodiment include a semiconductor chip 10, a heat sink 11, a plurality of spaced apart C-shaped leads 12, and a solid encapsulant 13. These components are interconnected as illustrated in the above two figures.

Chip 10 has a pair of oppositely facing major surfaces 10a and 10b; and an integrated circuit is disposed on surface 10a. All of the nodes of that circuit from which electrical signals are sent to or received from have a raised pad 10c. These pads suitably are 0.001 inches high, and are 0.004 by 0.004 inches in area.

Surface 12b, by comparison, contains no circuitry and is attached directly to heat sink 11. Preferably, the attachment is made with an adhesive having high heat transfer characteristics, such as an epoxy that contains boron nitride particles. Also preferably, the cross-section of heat sink 11 substantially matches surface 10b; and the heat sink is made of a good thermal conductor such as Kovar or copper.

All of the C-shaped leads 12 are bonded at one end respectively to the raised pads 10c. From there, the leads 12 extend outward past the periphery of chip 10. Then they turn 90° and run parallel to and away from heat sink 11. Then they make another 90° turn and extend inward towards each other. Suitably, each of the leads 12 are only 0.002 inches thick and 0.005 inches wide.

Chip 10, heat sink 11, and leads 12 are all held securely in place by encapsulant 13. This encapsulant covers all of chip 10 plus adjacent portions of heat sink 11 and leads 12. A variety of materials may be used to form the encapsulant, such as plastic or ceramic for example.

That portion of encapsulant 13 which overlies surface 10c preferably is shaped to have a rim 13a which forms a cavity 13b. The leads 12 are then bent over rim 13 and into cavity 13b. This helps to hold the leads in place as they extend towards each other. Also, the portions of the leads 12 which extend into cavity 13b may be trimmed to have a reduced width. This decreases the potential for shorts occurring between the leads in the cavity.

One important feature of the above described design is that only one bonding operation is required for each of the leads 12 in the IC package. Thus, the package is relatively inexpensive to fabricate. In addition, the above described design occupies only a minimal amount of surface area on a circuit board. For example, chip 10 (and the attached heat sink 11) typically are 0.125 inches on a side; and encapsulant 13 need only extend outward from the side of the chip and the heat sink by approximately 0.050 inches. Thus, the IC package typically has a width W of only 0.225 inches.

The height H of the package depends primarily on the height of heat sink 11. It may extend no higher than the encapsulant 13 for low power chips; or it may extend past the encapsulant for high power chips. A typical height for the heat sink would be 0.30 inches.

In addition, chip 10 has a typical height of 0.015 inches. And the portion of the encapsulant 13 which covers surface 10a has a typical height of 0.050 inches. Thus the overall height H of the package would typically be less than one-half inch.

The above IC package also may be mounted either directly to the surface or in a socket on a circuit board. In the former, contact is made between the leads 12 on the IC package and other leads 14 on the circuit board by means of solder 15. By comparison in the latter, contact is made between that portion of the leads 12 which lie parallel to heat sink 11 and a springy mechanical lead in the socket.

Referring now to FIGS. 3-6, several other embodiments of the invention will be described. These embodiments include all of the features of FIGS. 1 and 2; and in addition, they include other features which basically operates to hold the leads 12 more firmly in place as they extend towards each other.

In particular, the FIG. 3 embodiment includes a plurality of indentations 16 which are spaced apart around rim 13a. Each indentation serves as a guide for one of the leads 12 as they pass into cavity 13b. This prevents lateral movement and shorts between any two adjacent leads.

In the FIG. 4 embodiment, an adhesive material 17 is included to hold the leads 12 in place. This adhesive material is placed between the inner sides of cavity 13b and each of the leads 12. Suitably, the adhesive 17 may be comprised of an epoxy or plastic.

In the FIG. 5 embodiment, the leads 12 are held in place by a solid mass 18 which completely fills cavity 13b. Mass 18 may suitably be comprised of the same material as mass 17. During fabrication, mass 18 is poured in a fluid state into cavity 13b. Thereafter, mass 18 hardens and remains permanently in place.

In the FIG. 6 embodiment, the leads 12 are also held in place by a solid mass 19 that completely fills cavity 13b. However, mass 19 is a preformed solid part. After it's formation it is wedged into the cavity to press the leads 12 against the inner sides of rim 13a. Suitably, mass 19 may be comprised of a plastic or ceramic.

Referring now to FIGS. 7A-7D, a process for fabricating any of the above embodiments of the invention will be described. As a first step, all of the leads 12 are bonded to their corresponding pads on chip 10. This step is illustrated in FIG. 7A.

For mass production purposes, the leads 12 of several IC packages preferably are linked together by means of a metal frame 20 and a plurality of dam bars 21. This is achieved by forming the leads, the frame, and the dam bars simultaneously from a single metal strip. Subsequently, after the leads are attached to the chip, they are trimmed from the frame and the dam bars. The resulting product is illustrated in FIG. 7B.

Next, heat sink 11 is attached to chip 10. Then, the resulting structure is put in a mold 22 as illustrated in FIG. 7C. Mold 22 is then filled through an orifice 23 with the encapsulating mass 13 in fluid form.

After mass 13 has hardened, it and the encapsulated components are removed from the mold. Then the leads 12 are bent around rim 13a and into cavity 13b. This is illustrated in FIG. 7D. Additional steps may also be included to further secure the leads 12 in place as was previously described in conjunction with FIGS. 3-6.

Various preferred embodiments and methods of fabricating the invention have now been described in detail. In addition, various changes and modifications may be made to these details without departing from the nature and spirit of the invention. For example, the encapsulating mass 13 may be fabricated from two separate preformed ceramic parts. These parts are sandwiched together, with the chip and leads of FIG. 7B lying therebetween; and they are held together by an adhesive.

Therefore, since may such modifications are possible, it is to be understood that the invention is not limited to said details but is defined by the appended claims.

What is claimed is:

1. An integrated circuit package comprised of:
   a substantially flat semiconductor chip having first and second oppositely facing major surfaces with said first major surface containing both said integrated circuit and a plurality of raised pads connected to said circuit;
   an elongated heat sink having a cross-section that substantially matches said second major surface and which is attached at one end thereof by an adhesive to said second major surface;
   a plurality of spaced apart C-shaped leads respectively connected at one end thereof to said raised pads; each of said leads extending outward from said pads beyond the periphery of said chip, then parallel to the direction of elongation and away from said heat sink, and then inward towards each other; and
   a solid mass encapsulating said chip, only a portion of said elongated heat sink with said portion being adjacent said chip, and said outward extending portion of said leads to rigidly hold said encapsulated components in place.

2. An integrated circuit package according to claim 1 wherein said solid mass has a cavity with a surrounding rim directly overlying the first major surface of said chip, and wherein said leads are bent over said rim into said cavity to hold them in place as they extend towards each other.

3. An integrated circuit package according to claim 2 wherein said rim has respective indentations for each of said leads to keep them spaced apart.

4. An integrated circuit package according to claim 2, and further including an adhesive material between said leads and said rim to hold said leads in place.

5. An integrated circuit package according to claim 2, and further including a second solid mass filling said cavity to hold said leads therein.

6. An integrated circuit package according to claim 2 wherein said encapsulating mass is plastic.

7. An integrated circuit package according to claim 2 wherein said encapsulating mass is ceramic.

* * * * *